(12) United States Patent
Baba-Ali

(10) Patent No.: US 7,354,169 B2
(45) Date of Patent: Apr. 8, 2008

(54) PATTERN GENERATOR USING A DUAL PHASE STEP ELEMENT AND METHOD OF USING SAME

(75) Inventor: Nabila Baba-Ali, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/878,695

(22) Filed: Jul. 26, 2007

(65) Prior Publication Data

US 2007/0268542 A1 Nov. 22, 2007

Related U.S. Application Data

(62) Division of application No. 10/995,092, filed on Nov. 24, 2004.

(51) Int. Cl.
*G02B 5/08* (2006.01)

(52) U.S. Cl. .................................. 359/855; 359/223

(58) Field of Classification Search ................ 359/855, 359/862, 212, 223
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,885,494 B2 | 4/2005 | Patel et al. | |
| 2003/0210383 A1* | 11/2003 | Bjorklund et al. | .......... 359/855 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2006/0109576 A1 | 5/2006 | Baba-Ali | |
| 2006/0132887 A1 | 6/2006 | Baba-Ali et al. | |

FOREIGN PATENT DOCUMENTS

| WO | WO 98/33096 | 7/1997 |
|---|---|---|
| WO | WO 98/38597 | 9/1998 |

* cited by examiner

*Primary Examiner*—Euncha P. Cherry
(74) *Attorney, Agent, or Firm*—Sterne, Kessler, Goldstein & Fox P.L.L.C.

(57) ABSTRACT

A system and method are used to pattern light using an illumination system, an array of individually controllable components, and a projection system. The illumination system supplies a beam of radiation. The array of individually controllable elements patterns the beam. The array of individually controllable elements comprises mirrors having first and second steps on opposite edges. The projection system projects the patterned beam onto a target portion of an object. In various examples, the object can be a display, a semiconductor substrate or wafer, a flat panel display glass substrate, or the like, as is discussed in more detail below.

9 Claims, 8 Drawing Sheets

PATTERN GENERATOR USING A DUAL PHASE STEP ELEMENT AND METHOD OF USING SAME

CROSS REFERENCE TO RELATED APPLICATIONS

This application is a divisional of pending U.S. application Ser. No. 10/995,092, filed Nov. 24, 2004, which is incorporated by reference herein in its entirety.

BACKGROUND

1. Field of the Invention

The present invention relates to a light patterning device and method of using same.

2. Related Art

A patterning device is used to pattern incoming light. A static patterning device can include reticles or masks. A dynamic patterning device can include an array of individually controllable elements that generate a pattern through receipt of analog or digital signals. Example environments for use of the patterning device can be, but are not limited to, a lithographic apparatus, a projector, a projection display apparatus, or the like.

When imaging with micromirror arrays as the object, the phase of the light reflected by each mirror is critical. For example, when a flat tilting mirror is untilted (e.g., resting) light at the image plane and/or collected at projection optics is considered to have on average zero phase, i.e., has positive amplitude. During tilting of the mirror, there is an tilt angle at which no light on average is directed toward the image plane and/or is collected at projection optics, so the average amplitude of the light at the image plane goes to zero. Then, as the mirror continues to tilt, out of phase light reaches the image plane and/or is collected at projection optics, which is considered to be negative amplitude light. In conventional arrays of individually controllable elements having tilting mirrors, a maximum amount of negative light reaching the image plane is much smaller (e.g., of lower intensity or amplitude) than a maximum amount of positive light reaching the image plane.

When imaging with tilting mirrors, there can be a telecentricity error. Telecentricity can occur during patterning on an object as a pattern goes into and out of focus, and causes an image being formed to move/shift.

Currently, arrays of individually controllable elements can include various types of mirrors. Mirror types include, but are not limited to, flat tilting mirrors, single phase-step tilting mirrors, piston mirrors, or hybrid mirrors combining tilt and piston actions. However, because of intensity modulation constraints (e.g., unequal maximum amplitude of positive and negative light) these arrays cannot effectively emulate phase shifting masks and/or are inefficient when correcting telecentric errors. Individually, piston mirrors have a pure phase modulation effect, but amplitude modulation can also be obtained by combining piston mirrors into superpixels. A superpixel is formed when groups of pixels (e.g., 2×2, 4×4, or 8×8, etc) are combined to create one large pixel. This superpixel can collect increased amounts of light. This increases sensitivity (e.g., speed), but can sacrifice resolution. These superpixels can then behave as graytone pixels with the capability of achieving an intensity modulation anywhere between 100% positive phase intensity and −100% negative phase intensity. There are, however, as discussed above, limitations in replicating the effect of assist features smaller than the superpixel.

Another alternative, also discussed above, is a single phase-step tilting mirror ($\lambda/4$ height step and phase step of $\lambda/2$, where $\lambda$ is an imaging wavelength), for example, by Micronic Laser Systems of Sweden. This mirror can achieve an intensity modulation anywhere between +50% and −50%. When at rest, no light enters a pupil of a projection system because, due to the step, half the light has a zero degree phase and the other half of the light has a 180 degree phase. As the mirror is tilted, light is captured or collected by the projection system, where a direction of tilt determines whether positive or negative light is captured or collected. Because of the symmetry of the single step mirror, equal amounts of positive and negative light can be captured or collected by the projection system. However, to correct for telecentric errors, the one step mirror requires alternating the position of the step (right or left), which is discussed below. This results in the dependence of the tilt angle sign on the position of the edge. This means that in order to achieve a given graytone with a particular mirror, the sign of the tilt angle needed requires knowledge of where the step is located, which creates an additional strain on the data path. In addition, mirror curling at the edges is likely to be exacerbated on a thinner side of the mirror and result in "tilt errors."

Therefore, what is needed is an array of individually controllable elements, where each individually controllable element when used in the array has better positive and negative intensity characteristics and/or allows for effective and efficient telecentric error correction.

SUMMARY

According to one embodiment of the present invention, there is provided a system comprising an illumination system, an array of individually controllable elements, and a projection system. The illumination system supplies a beam of radiation. The array of individually controllable elements patterns the beam. The array of individually controllable elements comprises mirrors having first and second steps on opposite edges. The projection system projects the patterned beam onto a target portion of an object.

According to one embodiment of the present invention, there is provided a patterning device comprising an array of first reflecting components, an array of second reflecting components, and an array of controllers. Each of the first reflective components has a first width and a first length. Respective ones of the array of second reflective components are coupled to a central portion of respective ones of the array of first reflective components. Each of the second reflective components has a second width, which is substantially equal to the first width, and a second length, which is smaller than the first length. First steps are formed between first edges of respective ones of the coupled together first and second reflective components. Second steps are formed between second edges of respective ones of the coupled together first and second reflective components. The array of controllers are coupled to respective ones of the coupled together first and second reflective components. Each of the controllers controls the movement of each of the respective ones of the coupled together first and second reflective components.

According to another embodiment of the present invention, there is provided a patterning device comprising a first and second array of reflective components and an array of controllers. The array of first reflective components each have a first width and a first length. Respective ones of the array of second reflective components are coupled to a peripheral portion of respective ones of the array of first reflective components. Each of the second reflective components have a second width, which is substantially equal to the first width, and a second length, which is smaller than the first length. First steps are formed between first edges of respective ones of the coupled together first and second reflective components and second steps are formed between second edges of respective ones of the coupled together first and second reflective components. The array of controllers is coupled to respective ones of the coupled together first and second reflective components. Each of the controllers control the movement of each of the respective ones of the coupled together first and second reflective components.

According to another embodiment of the present invention, there is provided a device manufacturing method comprising the following steps. Patterning a beam of radiation using an array of individually controllable elements, each element in the array having first and second steps on opposite edges. Projecting the patterned beam onto a target portion of an object.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Overview

Figure 1:
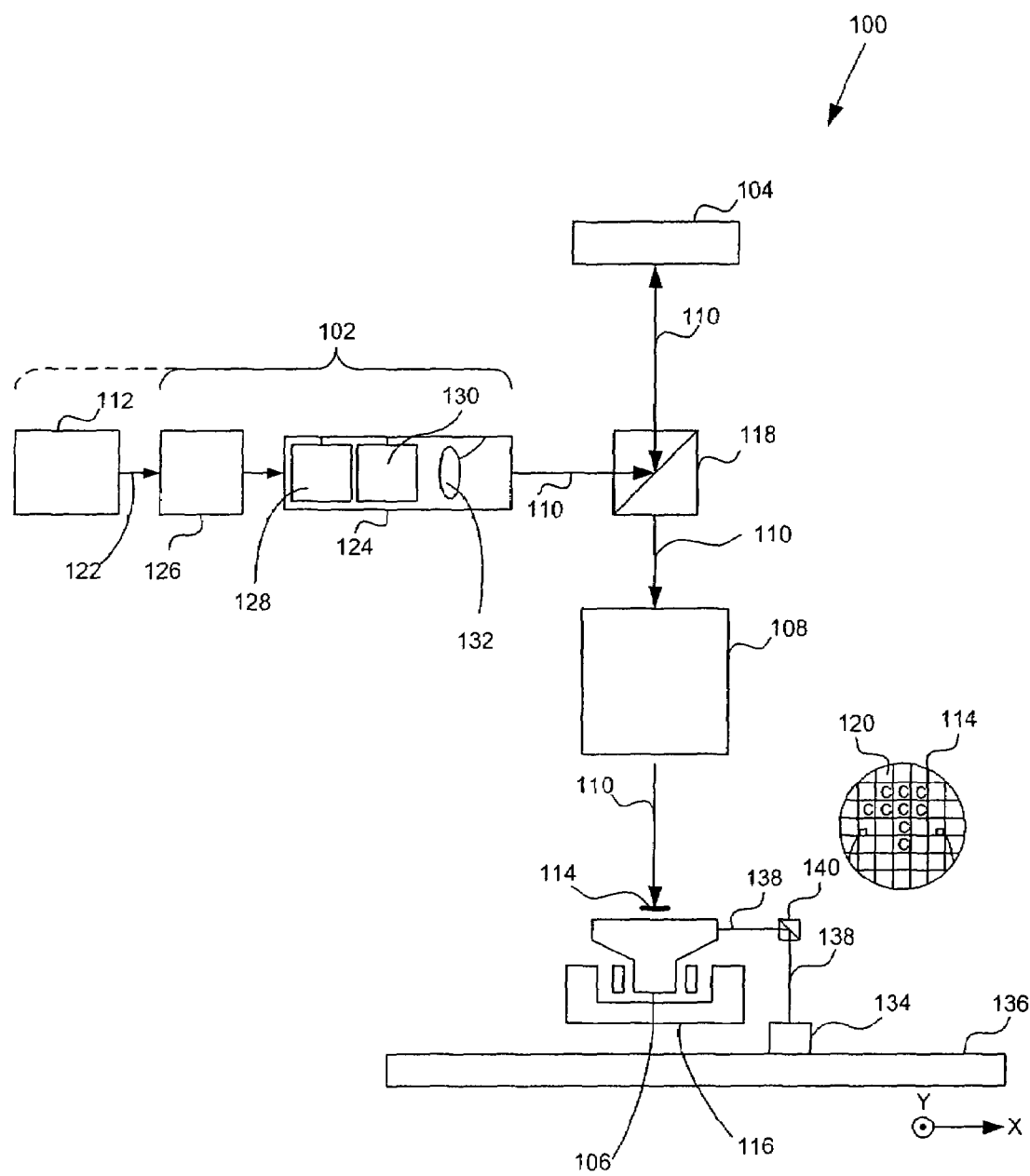
FIG. 1 depicts a lithographic apparatus, according to one embodiment of the invention.

Although specific reference may be made in this text to the use of a patterning device in a lithographic system that patterns a substrate, it should be understood that the patterning device described herein may have other applications, such as in a projector or a projection system to pattern an object or display device (e.g., in a projection television system, or the like). Therefore, the use of the lithographic system and/or substrate throughout this description is only to describe example embodiments of the present invention.

A system and method are used to pattern light using an illumination system, an array of individually controllable devices, and a projection system. The illumination system supplies a beam of radiation. The array of individually controllable elements patterns the beam. The array of individually controllable elements comprises mirrors having first and second steps on opposite edges. The projection system projects the patterned beam onto a target portion of an object. In various examples, the object can be a display device, a semiconductor substrate or wafer, a flat panel display glass substrate, or the like, as is discussed in more detail below.

The dual-step element provides an increased range of modulation of intensity compared to conventional systems. The dual-step element also provides substantially equal positive and negative maximum amplitudes, which allows for sharper images to be formed by an array of individually controllable dual-step elements at an image plane in which the object is located.

Terminology

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, micro and macro fluidic devices, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed above and below.

A programmable mirror array may comprise a matrix-addressable surface having a viscoelastic (i.e., a surface having appreciable and conjoint viscous and elastic properties) control layer and a reflective surface. The basic principle behind such an apparatus is that, for example, addressed areas of the reflective surface reflect incident light as diffracted light, whereas unaddressed areas reflect incident light as undiffracted light. The addressing can be binary or through multiple intermittent angles. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light. This is sometimes referred to as a grating light valve.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In one example, groups of the mirrors can be coordinated together to be addresses as a single "pixel." In this example, an optical element in a illumination system can form beams of light, such that each beam falls on a respective group of mirrors.

In both of the situations described here above, the array of individually controllable elements can comprise one or more programmable mirror arrays.

A programmable LCD array can also be used.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

In the lithography environment, the term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the substrate and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Exemplary Environment for a Patterning Device

Although the patterning device of the present invention can be used in many different environments, as discussed above, a lithographic environment will be used in the description below. This is for illustrative purposes only.

A lithographic apparatus is a machine that applies a desired pattern onto a target portion of an object. The lithographic apparatus can be used, for example, to pattern an object in a biotechnology environment, in the manufacture of ICs, flat panel displays, micro or nano fluidic devices, and other devices involving fine structures. In a an IC-based lithographic environment, the patterning device is used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). As discussed above, instead of a mask, in maskless IC lithography the patterning device may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction. These concepts will be discussed in more detail below.

FIG. 1 schematically depicts a lithographic projection apparatus 100, according to one embodiment of the invention. Apparatus 100 includes at least a radiation system 102, a patterning device 104 (e.g., a static device or an array of individually controllable elements), an object table 106 (e.g., a substrate table), and a projection system ("lens") 108.

Radiation system 102 is used to supply a beam 110 of radiation, which in this example also comprises a radiation source 112.

Array of individually controllable elements 104 (e.g., a programmable mirror array) is used to pattern beam 110. In one example, the position of the array of individually controllable elements 104 is fixed relative to projection system 108. However, in another example, array of individually controllable elements 104 is connected to a positioning device (not shown) that positions it with respect to projection system 108. In the example shown, each element in the array of individually controllable elements 104 are of a reflective type (e.g., have a reflective array of individually controllable elements).

Object table 106 is provided with an object holder (not specifically shown) for holding an object 114 (e.g., a resist coated silicon wafer, a glass substrate, or the like). In one example, substrate table 106 is connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) is used to project the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser, or the like) produces a beam of radiation 122. Beam 122 is fed into an illumination system (illuminator) 124, either directly or after having traversed conditioning device 126, such as a beam expander 126, for example. Illuminator 124 can comprise an adjusting device 128 that sets the outer and/or inner radial extent (commonly referred to as σ-outer and σ-inner, respectively) of the intensity distribution in beam 122. In addition, illuminator 124 can include various other components, such as an integrator 130 and a condenser 132. In this way, beam 110 impinging on the array of individually controllable elements 104 has a desired uniformity and intensity distribution in its cross-section.

In one example, source 112 is within the housing of lithographic projection apparatus 100 (as is often the case when source 112 is a mercury lamp, for example). In another example, source 112 is remotely located with respect to lithographic projection apparatus 100. In this latter example, radiation beam 122 is directed into apparatus 100 (e.g., with the aid of suitable directing mirrors (not shown)). This latter scenario is often the case when source 112 is an excimer laser. It is to be appreciated that both of these scenarios are contemplated within the scope of the present invention.

Beam 110 subsequently interacts with the array of individually controllable elements 104 after being directed using beam splitter 118. In the example shown, having been reflected by the array of individually controllable elements 104, beam 110 passes through projection system 108, which focuses beam 110 onto a target portion 120 of substrate 114.

With the aid of positioning device 116, and optionally interferometric measuring device 134 on a base plate 136 that receives interferometric beams 138 via beam splitter 140, substrate table 106 is moved accurately, so as to position different target portions 120 in a path of beam 110.

In one example, a positioning device (not shown) for the array of individually controllable elements 104 can be used to accurately correct the position of the array of individually controllable elements 104 with respect to the path of beam 110, e.g., during a scan.

In one example, movement of substrate table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 may alternatively/additionally be moveable, while substrate table 106 and/or the array of individually controllable elements 104 may have a fixed position to provide the required relative movement.

In another example, substrate table 106 may be fixed, with substrate 114 being moveable over substrate table 106. Where this is done, substrate table 106 is provided with a multitude of openings on a flat uppermost surface. A gas is fed through the openings to provide a gas cushion, which supports substrate 114. This is referred to as an air bearing arrangement. Substrate 114 is moved over substrate table 106 using one or more actuators (not shown), which accurately position substrate 114 with respect to the path of beam 110. In another example, substrate 114 is moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography, and for other applications.

The depicted apparatus 100 can be used in at least one of four modes:

1. Step mode: the entire pattern on the array of individually controllable elements 104 is projected during a single exposure (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 moves in a given direction (e.g., a "scan direction," for example, the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary, and the entire pattern is projected onto a target portion 120 of substrate 114 using pulsed radiation system 102. Substrate table 106 is moved with an essentially constant speed, such that patterned beam 110 scans a line across substrate 106. The pattern on the array of individually controllable elements 104 is updated as required between pulses of radiation system 102, and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

Exemplary Elements in the Array of Programmable Elements

Figure 2:
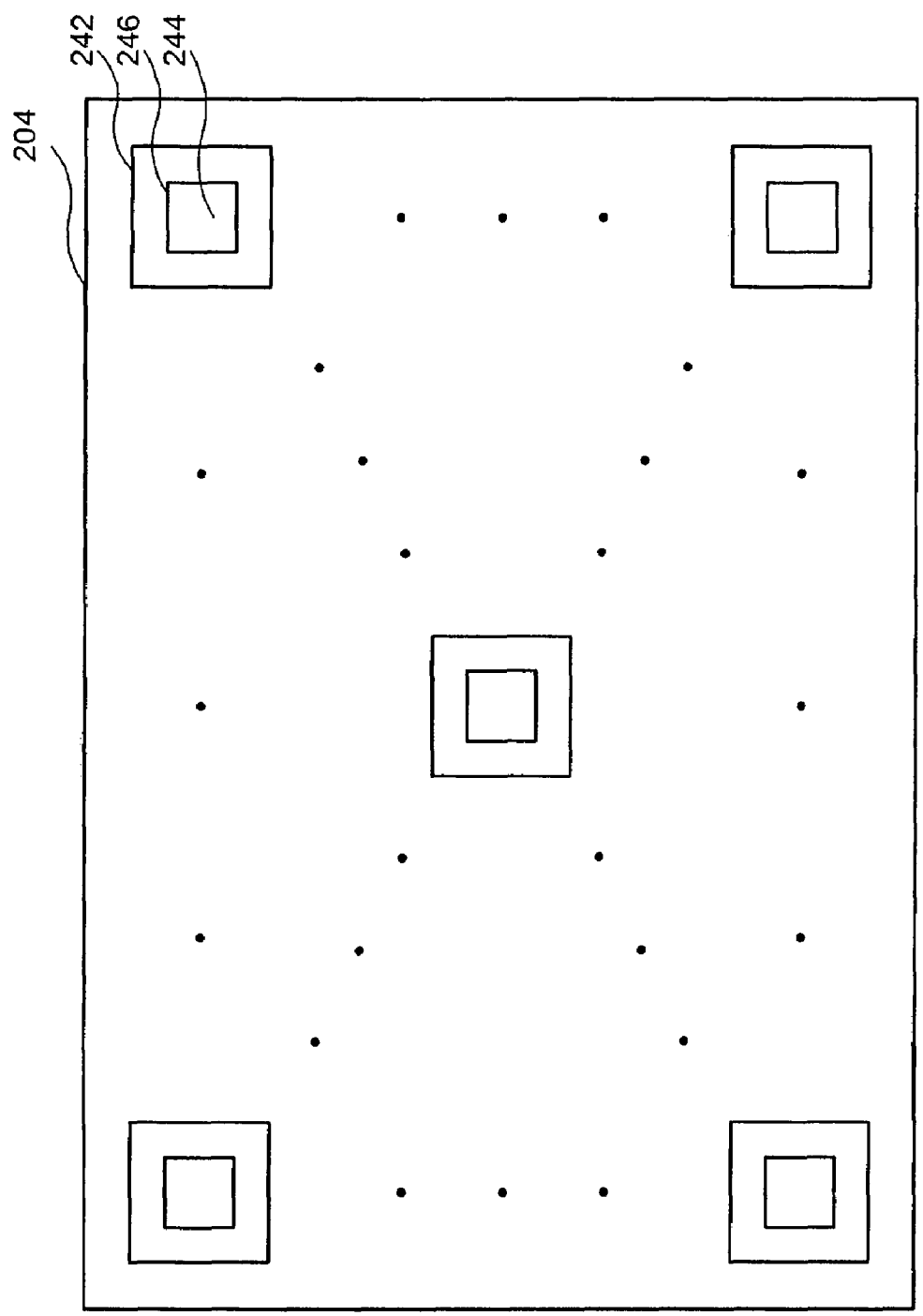
FIG. 2 depicts a patterning device, according to one embodiment of the invention.

FIG. 2 shows a top view of an array of individually controllable elements 204, according to one embodiment of the present invention. Each element 242 in array of individually controllable elements 204 includes an active area 244 and an inactive area 246. Active areas 244 can be formed of mirrors, liquid crystal display elements, grating light valves, etc., discussed in more detail above, and are used to pattern incoming light, while inactive areas 246 include circuitry and mechanical devices and structures. The devices and structures in inactive areas 246 are used to control and/or move (e.g., tilt, piston, etc.) active areas 244 to turn active areas 244 ON and OFF, and in some examples, to move active areas 244 to and through various intermediate states.

Figure 3:
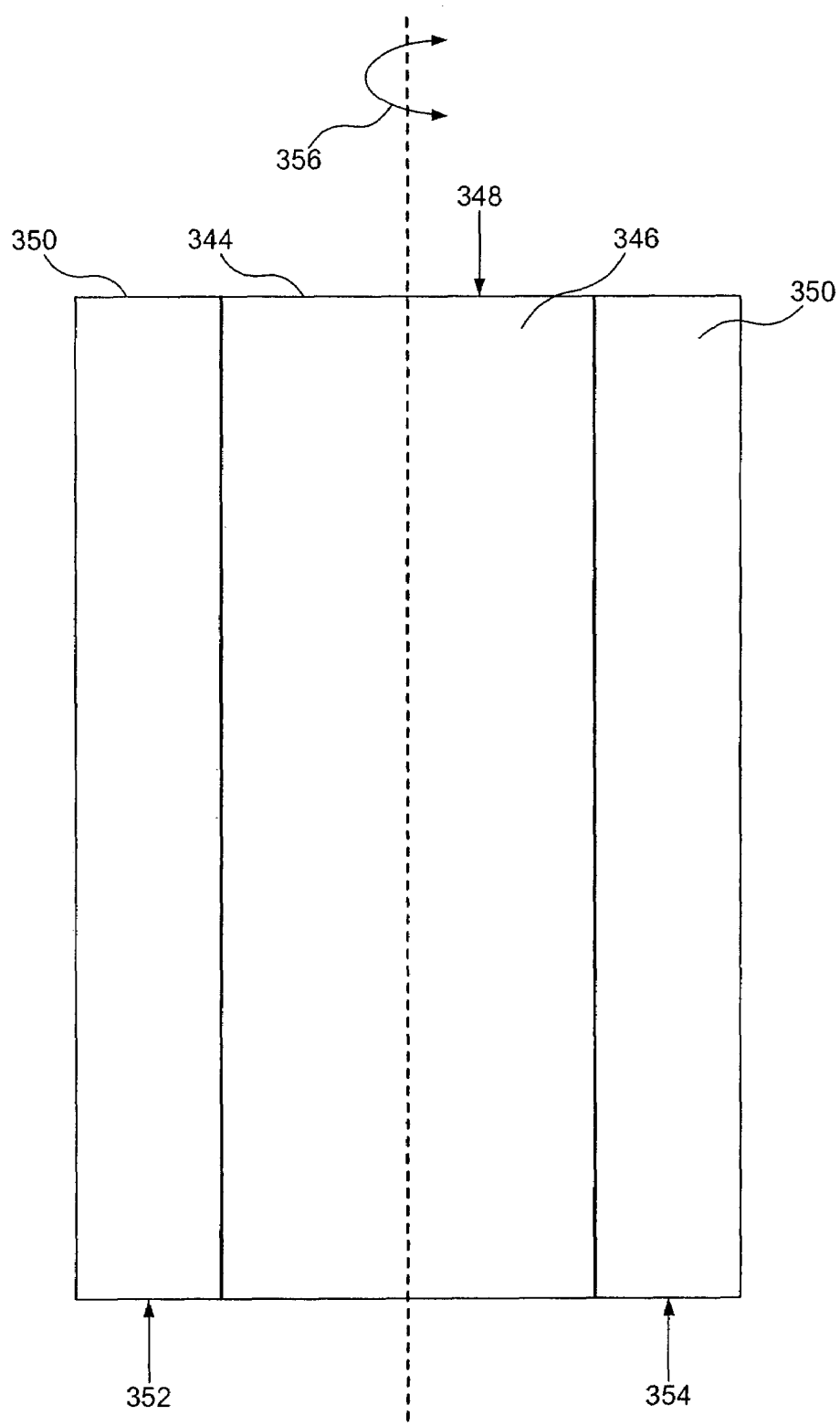
FIGS. 3 and 4 depict a top and side view, respectively, of an element in a patterning device, according to one embodiment of the present invention.
Figure 4:
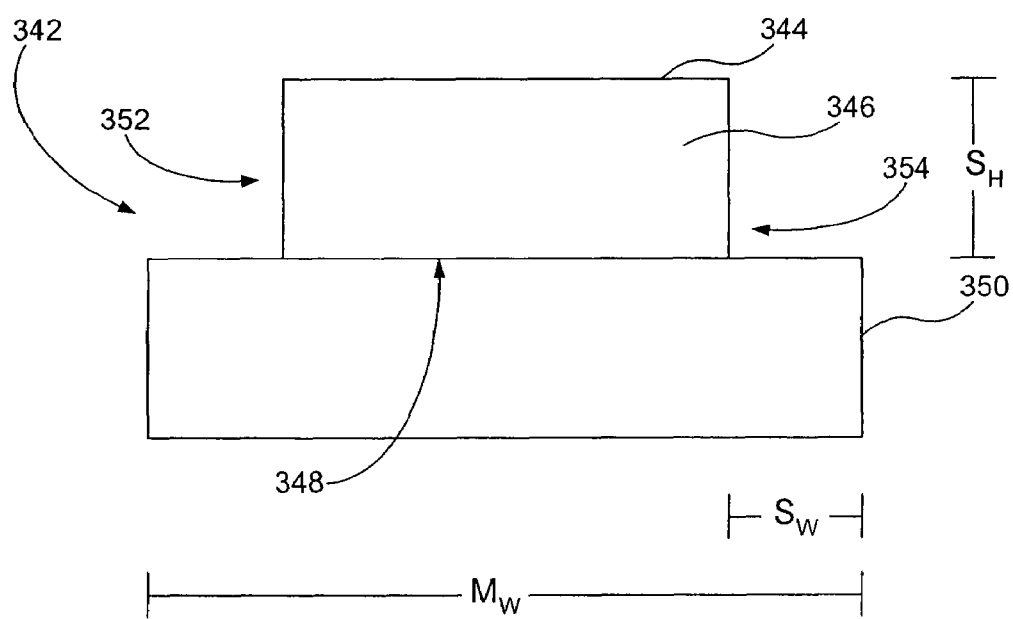

FIGS. 3 and 4 depict a top and side view, respectively, of an active area 344 (e.g., reflective device, mirror, etc.) of an element 342 in an array of controllable elements 204 (FIG. 2), according to one embodiment of the present invention. A mirror 344 includes a first portion 346 coupled to a central area 348 of a second portion 350. In this embodiment, both portions 346 and 350 are reflective portions. Through the coupling, first and second steps 352 and 354 are formed. Each step 352/354 has a step height ($S_H$) and a step width ($S_W$). In one example, mirror 344 is a tilting mirror having $\lambda/4$ height steps 352/354 (i.e., $S_H=\lambda/4$). Also, mirror 344 has a mirror width ($M_W$). Mirror 344 tilts around rotation around axis 356. As is known in the art, depending on an angle and direction of tilt, light reflecting from steps 352 and 354 will undergo a positive or negative phase change, as discussed above.

Figure 8:
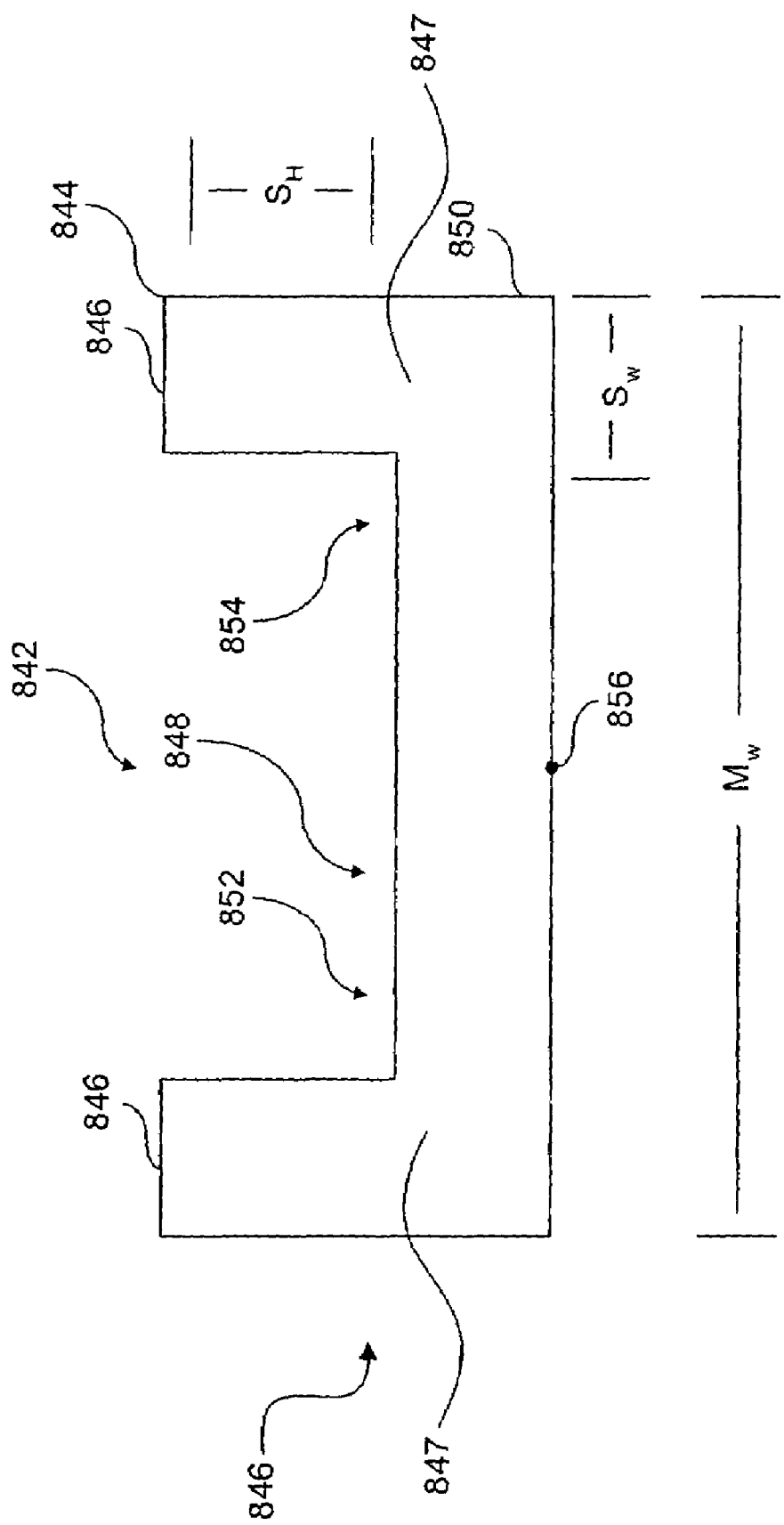
FIG. 8 depicts a side view of an element in a patterning device, according to one embodiment of the present invention.

FIG. 8 depicts a side view of an active area 844 (e.g., reflective device, mirror, etc.) of an element 842 in an array of controllable elements 204 (FIG. 2), according to one embodiment of the present invention. A mirror 844 includes a first portion 846 coupled to or formed at peripheral areas 847, which is outside a central area 848 of a second portion 850. Thus, element 842 can be fabricated either by removing material from central area 848 or adding material to peripheral portions 847. In this embodiment, both portions 846 and 850 are reflective portions. Through the coupling/formation, first and second steps 852 and 854 are formed. Each step 852/854 has a step height ($S_H$) and a step width ($S_W$). In one example, mirror 844 is a tilting mirror having $\lambda/4$ height steps 852/854 (i.e., $S_H=\lambda/4$). Also, mirror 844 has a mirror width ($M_W$). Mirror 844 tilts around rotation around axis 856. As is known in the art, depending on an angle and direction of tilt, light reflecting from steps 852 and 854 will undergo a positive or negative phase change, as discussed above.

It is to be appreciated that elements 342 and 842 will function similarly, thus only element 342 will be described hereinafter. The functionality described below applies equally to element 842, as appropriate.

In various examples, using appropriate step height/width parameters, mirror 344 can emulate Binary masks, attenuating phase-shift mask (Att PSMs) and alternating phase-shift masks (Alt PSMs).

Phase-shifting mask technology refers to a photolithographic mask that selectively alters the phase of the light passing through certain areas of the mask to improve resolution and depth of focus according to principles of destructive interference. For example, in a simple attenuating phase shifting mask, a layer of material is selectively located to attenuate light passing through it and shift the light 180 degrees out of phase from light passing through adjacent areas not covered by the phase shifting material. This 180 degree phase difference causes any light overlapping from two adjacent apertures to interfere destructively, thereby reducing the width of the feature at the wafer. This is obtained in maskless lithography through use of control of each individually controllable element and/or groups of individually controllable elements to form patterns that patterning impinging light to achieve these light characteristics.

An attenuating phase shifting mask differs from an alternating phase shifting mask in that the alternating phase shifting mask generally does not have a partially transmitting phase shifting material, but rather includes trenches in the mask to shift the phase of transmitted light adjacent to the features.

Thus, PSMs have transmissive areas that are in or out of phase with respect to each other. When two transmissive areas are out of phase with respect to each other, images at an image plane are made sharper. Thus, through appropriate selection of step heights and widths for elements 344 when used in array 104 (FIG. 1) or 204 (FIG. 2), for example, emulation of one of these phase shifting masks can be achieved, which allows for a shaper image to be formed at an image plane (not shown) than conventional mirrors discussed.

In one example, when compared to flat tiling mirrors, mirror 344 can emulate an Alt PSMs with considerably less light loss than the flat tiling mirrors described above. For example, 95% loss for the flat tilting mirror compared to 64% loss for mirror 344. Also, being able to emulate Att PSMs allows for desirable depth of focus (e.g., an increased depth of focus) and exposure latitude characteristics from mirror 344.

In one example, a size of assist features (e.g., features intended to improve lithography on a wafer, for example, optical proximity correction features, serifs, hammerheads, scattering bars, anti-scattering bars, etc.) that can be replicated with mirror 344 is only limited by the pixel size. In contrast, when using conventional piston mirrors a smallest assist feature cannot be less than a super-pixel size, e.g., at least twice the pixel size.

Also, as compared to a single step mirror described above, since steps 352/354 are added on each side of mirror 344, there is no asymmetric deformation as a result of adding steps 352/354. Also, thicker edges, as compared to exemplary single step mirrors described above, due to dimensions of steps 352/354 should reduce the amount of edge curling compared to a single step mirror.

Exemplary Reflectance Characteristics of Dual Phase Step Elements

Figure 5:
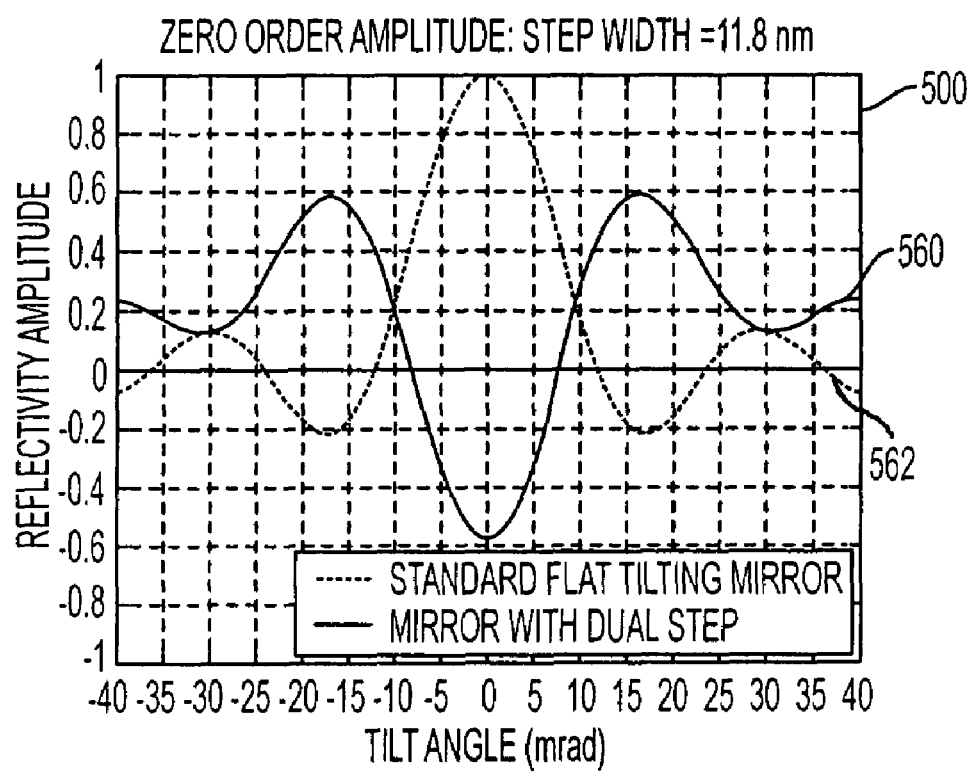
FIGS. 5 and 6 are graphs depicting reflectivity over a range of tilt angles of different sized elements in a patterning device, according to embodiments of the present invention.
Figure 6:
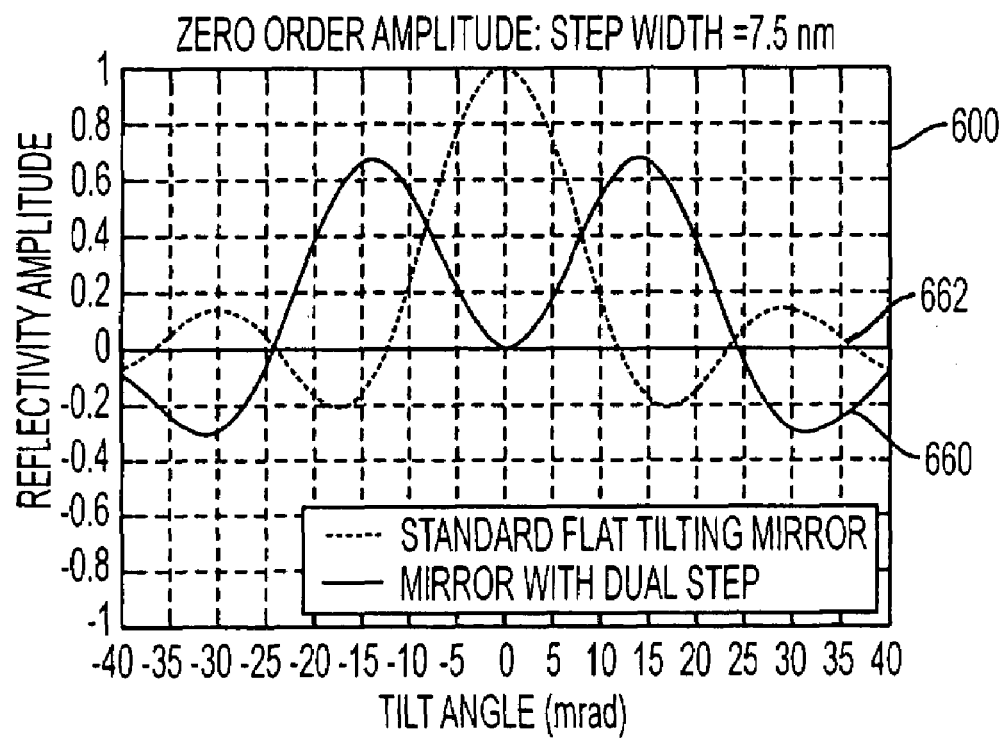

FIGS. 5 and 6 show graphs 500 and 600 that depict reflectivity over a range of tilt angles for flat mirrors as compared to dual phase step mirror 344 (FIGS. 3 and 4), according to embodiments of the present invention. In each graph, a reflectivity curve 560/660 is a result produced using a dual phase step mirror 344. A reflectivity curve 562/662 is a result produced using a conventional flat mirror.

In various examples, adjusting the step width of mirror 344 results in mirror reflectivity curve 560/660 to either optimize the ratio of positive versus negative amplitude, to extend a tilt range, to change the pixel state at rest depending on a desired application, or the like.

Flat tilting mirrors can achieve an intensity modulation anywhere between 100% positive phase intensity and 4.7% negative phase intensity. This is shown in FIGS. 5 and 6 in curves 562 and 662, respectively, which both show a maximum positive intensity of 1 and negative intensity of −2. This limited negative phase intensity has proven to be a major limitation in flat tilting mirrors emulating alternating phase shifting masks without significant light loss.

In one example, a reflectivity amplitude or graytone associated with tilting mirror 344 (FIGS. 3-4) with two λ/4 high height steps 352/354, where each phase step 352/354 is located at a distance $w_{step}$ (wafer scale) away from the nearest mirror edge, is given by:

$$A(0,0) = -\mathrm{sinc}\left(\frac{2\alpha Mw}{\lambda}\right) + 2\left(1 - 2\frac{w_{step}}{w}\right)\mathrm{sinc}\left(\frac{2\alpha Mw}{\lambda}\left(1 - 2\frac{w_{step}}{w}\right)\right)$$

where M is the demagnification of the optical system, w is the pixel size on wafer scale (actual mirror width/M), α is the tilt angle, wstep is the step width and λ is the imaging wavelength. The optical path difference for a phase step height of λ/4 is λ/2 because the incident light beam is reflected off the surface of the mirror 344, and hence the beam traverses steps 352/354 twice.

FIG. 5 is based on mirror 344 having a pixel size of about 30 nm (mirror size at an object (not shown)) and a step width of about 11.8 nm. In this example, step widths of steps 352 and 354 are chosen in order to produce a reflectivity curve 560 with equal positive and negative maximum amplitudes. The maximum negative amplitude is achieved at zero tilt (about −0.6 amplitude or about −36% intensity), while the maximum positive amplitude is obtained at about 17 mrad tilt (about 0.6 amplitude or about 36% intensity). The reflectivity zero crossing occurs at about 7.5 mrad tilt. In this example, mirror 344 can emulate binary, Att PSM, and Alt PSM reticles. The light loss when emulating Alt PSM masks is very small compared to what would be needed with a flat tilting mirror, as shown in curve 562.

FIG. 6 is based on mirror 344 having a pixel size of about 30 nm (mirror size at an object) and a step width of about 7.5 nm. The intensity modulation ranges of curve 660 are from about −10% to about +42%, relative to the flat tilting mirror curve 662.

Telecentric Error Correction Using a Dual Phase Step Reflection Device

Figure 7:
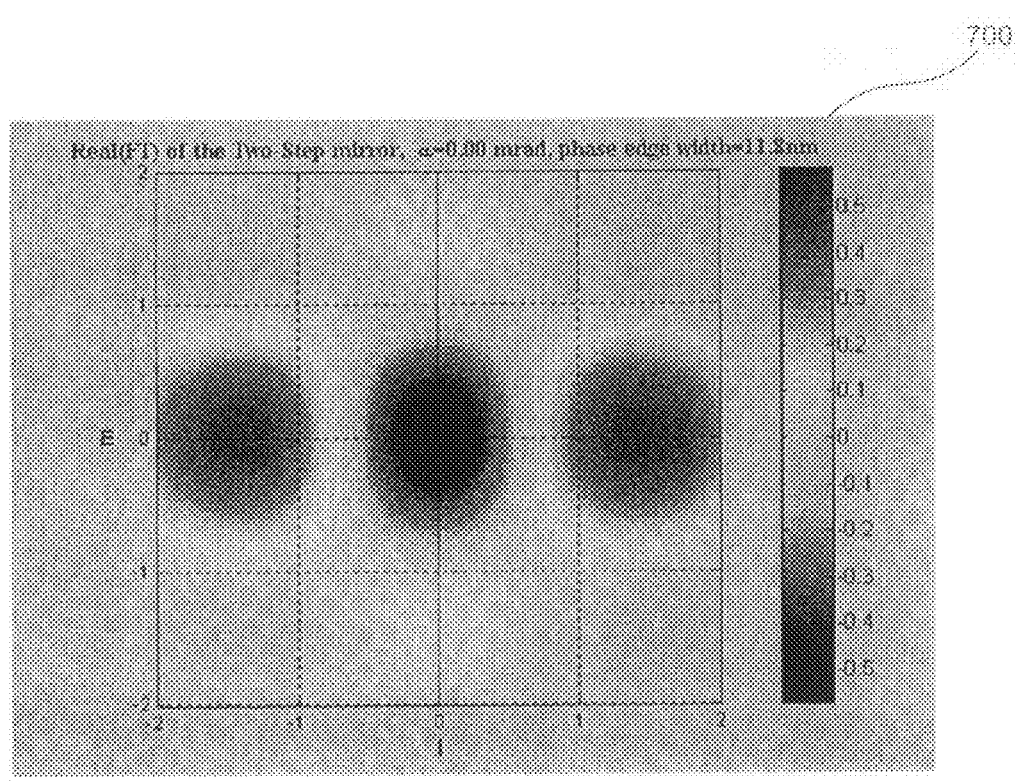
FIG. 7 shows a two dimensional diffraction pattern for a dual phase step element in a patterning device, according to embodiments of the present invention.

FIG. 7 shows a graph 700 illustrating a two dimensional diffraction pattern formed from light reflecting from mirror 344 when it is used in a patterning device (e.g., patterning device 104), according to embodiments of the present invention. In one example, a normalized 2D diffraction pattern 700 of is given by:

$$A(l,m) = \mathrm{sinc}(m)\left[-\mathrm{sinc}\left(l - \frac{2\alpha Mw}{\lambda}\right) + 2\left(1 - 2\frac{w_{step}}{w}\right)\mathrm{sinc}\left(\left(l - \frac{2\alpha Mw}{\lambda}\right)\left(1 - 2\frac{w_{step}}{w}\right)\right)\right]$$

where:

$$f_0 = \frac{1}{w}$$

$f_x = l \cdot f_0$
$f_y = m \cdot f_0$ l and m are normalized spatial frequencies when the amplitude is normalized to the peak amplitude of the diffraction pattern of the tilting mirror without the phase steps.

In the example shown, dual phase step mirror 344 has about a about 11.8 nm step width and is at about zero tilt. In this example, the symmetry of the diffraction pattern with respect to the vertical axis of the graph 700 shows that a graytone of mirror 344 depends on the magnitude of the tilt angle, but not a sign of the tilt angle. Thus, correcting for telecentric errors with mirror 344 can be carried out in the same way as for the conventional flat tilting mirror. For example, adjacent elements 344 in an array 204 (FIG. 2) have alternating signs (e.g., positive or negative) of their tilt angles, for instance in a checkerboard fashion. Unlike the piston superpixel or the single phase step mirror described above, correcting for the telecentric error with mirror 344 will produce no additional burden on a datapath.

In one example, using mirror 344 allows for tilting to be restricted to one direction only, and still result in both negative and positive amplitudes. This is in contrast to the single step mirror discussed above, which requires each mirror to tilt in both directions. Thus, in this example using mirror 344 provides a simple scheme for correcting non-telecentricity by simply alternating the sign of the tilt angle.

In contrast, as discussed above, to correct for telecentricity errors using the single phase step mirror requires alternating the position of the phase edge or step (right or left) and the sign of the tilt angle. This results in the dependence of the tilt angle sign on the position of the edge. This means that in order to achieve a given graytone with a particular mirror, the sign of the tilt angle needed will require knowledge of where the step is located, which creates an additional strain on the data path.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A patterning device, comprising:
an array of first reflective components, each of the first reflecting components having a first width and a first length;
an array of second reflective components, wherein respective ones of the array of second reflective components are coupled to a peripheral portion of respective ones of the array of first reflective components, each of the second reflective components having a second width, which is substantially equal to the first width, and a second length, which is smaller than the first length, such that first steps are formed between first edges of respective ones of the coupled together first and second reflective components and second steps are formed between second edges of respective ones of the coupled together first and second reflective components; and an array of controllers coupled to respective ones of the coupled together first and second reflective components, each of the controllers controlling the movement of each of the respective ones of the coupled together first and second reflective components.

2. The patterning device of claim 1, wherein a height and a width of each of the first and second steps of each of the coupled together first and second reflective component are sized to produce substantially equal positive and negative maximum intensities of reflected light over a range of tilt angles of each of the coupled together first and second reflective components.

3. The patterning device of claim 1, wherein default positions of each of the coupled together first and second reflective components are their ON states.

4. The patterning device of claim 1, wherein default positions of each of the coupled together first and second reflective components are their OFF states.

5. The patterning device of claim 1, wherein a height and a width of each of the first and second steps of each of the coupled together first and second reflective components are sized so that the patterning device emulates a binary reticle.

6. The patterning device of claim 1, wherein a height and a width of each of the first and second steps of each of the coupled together first and second reflective components are sized so that the patterning device emulates an attenuating phase shift reticle.

7. The patterning device of claim 1, wherein a height and a width of each of the first and second steps of each of the coupled together first and second reflective components are sized so that the patterning device emulates an alternating phase shift reticle.

8. The patterning device of claim 1, wherein:

a height of each of the first and second steps of each of the coupled together first and second reflective components is approximately $\lambda/4$, wherein $\lambda$ is wavelength of the beam of radiation of the illumination system.

9. The patterning device of claim 1, wherein a width of the first and second steps of each of the coupled together first and second reflective components is approximately 5 nm to 12 nm.

* * * * *